(12) United States Patent
Hol et al.

(10) Patent No.: US 9,081,307 B2
(45) Date of Patent: Jul. 14, 2015

(54) VARIABLE RELUCTANCE DEVICE, STAGE APPARATUS, LITHOGRAPHIC APPARATUS AND DEVICE MANUFACTURING METHOD

(75) Inventors: Sven Antoin Johan Hol, Eindhoven (NL); Johannes Petrus Martinus Bernardus Vermeulen, Helmond (NL); Wilhelmus Henricus Theodorus Maria Aangenent, 's-Hetogenbosch (NL); George Wilhelmus Johannes Clijsen, Veldhoven (NL); Johannes Antonius Gerardus Akkermans, Eindhoven (NL); Jacob Kornelis Ter Veer, Eindhoven (NL); Jeroen De Boeij, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 303 days.

(21) Appl. No.: 13/156,924

(22) Filed: Jun. 9, 2011

(65) Prior Publication Data

US 2012/0019794 A1    Jan. 26, 2012

Related U.S. Application Data

(60) Provisional application No. 61/362,887, filed on Jul. 9, 2010.

(51) Int. Cl.
*G03F 7/20* (2006.01)

(52) U.S. Cl.
CPC ........ *G03F 7/70758* (2013.01); *G03F 7/70775* (2013.01)

(58) Field of Classification Search
CPC .. G03F 7/707; G03F 7/70758; G03F 7/70775
USPC .......... 310/12.04, 12.05, 12.06, 12.18, 12.19, 310/12.21; 355/72, 75
See application file for complete search history.

(56) References Cited

U.S. PATENT DOCUMENTS

| | | | |
|---|---|---|---|
| 4,136,312 A | * | 1/1979 | Salon et al. .................. 324/545 |
| 5,449,985 A | | 9/1995 | Kanemitsu et al. |

(Continued)

FOREIGN PATENT DOCUMENTS

| | | |
|---|---|---|
| CN | 101310430 A | 11/2008 |
| CN | 101713930 A | 5/2010 |

(Continued)

OTHER PUBLICATIONS

English translation of JP 03-095415, published Apr. 19, 1991.*

(Continued)

*Primary Examiner* — Steven H Whitesell Gordon
(74) *Attorney, Agent, or Firm* — Sterne, Kessler, Goldstein & Fox P.L.L.C.

(57) ABSTRACT

A variable reluctance device includes first and second magnetic members, a coil, a measurement coil, and a control unit. The first and second magnetic members are displaceable relative to each other to provide a magnetic circuit having a variable reluctance. The coil for, in use, receiving a current for generating a magnetic flux through the magnetic circuit. The measurement coil for generating a measurement signal representative of the magnetic flux through the magnetic circuit, whereby the measurement coil is arranged to substantially enclose the magnetic flux through the magnetic circuit. The control unit arranged to receive the flux signal at an input terminal and, in response, provide a control signal based on the measurement signal at an output terminal for controlling an amplitude of the current or a force of a further device. The device can e.g., be applied in a stage apparatus or a lithographic apparatus.

13 Claims, 8 Drawing Sheets

(56) References Cited

U.S. PATENT DOCUMENTS

Figure 1:
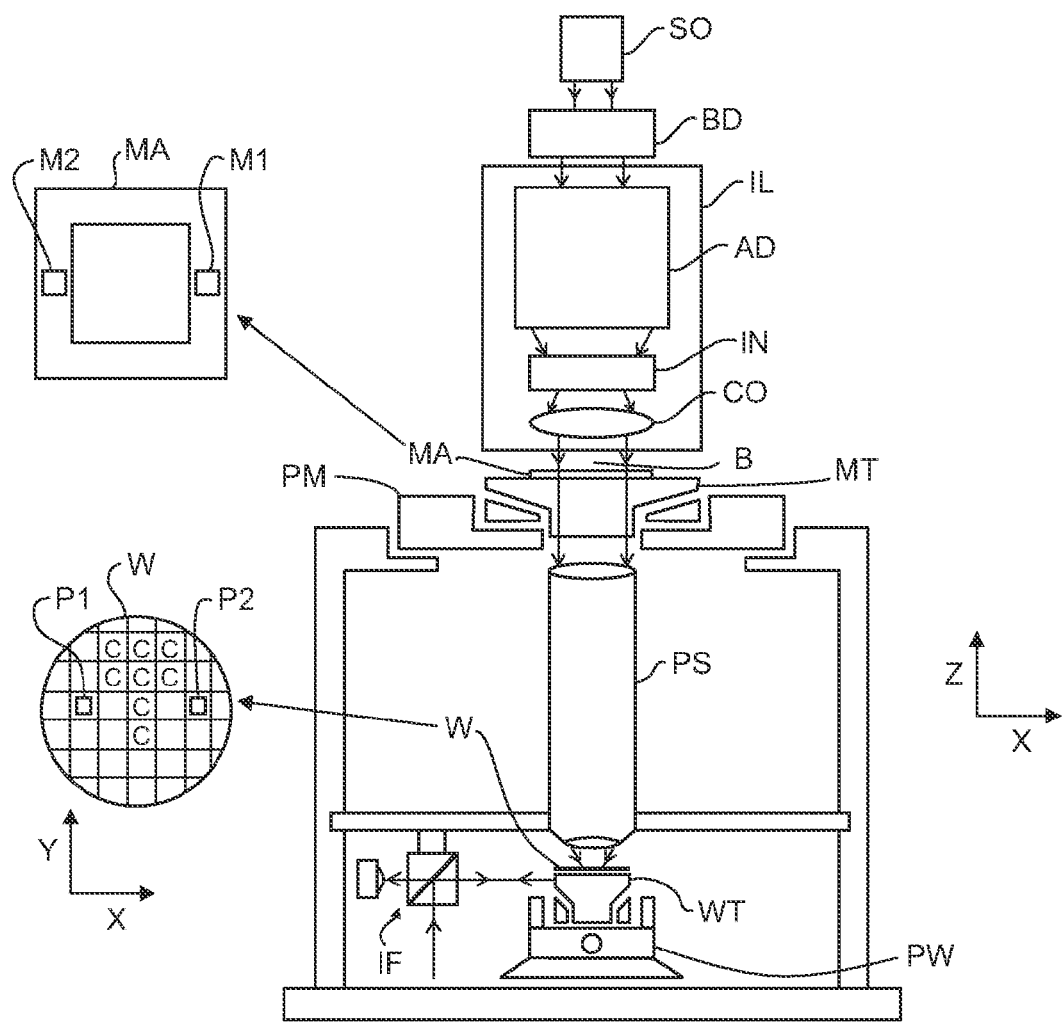

| | | |
|---|---|---|
| 6,036,162 A | 3/2000 | Hayashi |
| 6,897,758 B1 | 5/2005 | Baumgaertl et al. |
| 7,352,149 B2 | 4/2008 | Butler et al. |
| 7,456,935 B2 | 11/2008 | Cox et al. |
| 7,602,086 B2 | 10/2009 | Okada |
| 8,373,848 B2 | 2/2013 | Boon et al. |
| 2004/0095026 A1 | 5/2004 | Vaknin |
| 2005/0174551 A1* | 8/2005 | Phillips ............ 355/53 |
| 2006/0061751 A1* | 3/2006 | Teng et al. ......... 355/72 |
| 2007/0013895 A1* | 1/2007 | Okada ............... 355/72 |
| 2007/0285195 A1* | 12/2007 | Nehl et al. .......... 335/209 |
| 2009/0002659 A1 | 1/2009 | Hiyama |
| 2009/0045683 A1 | 2/2009 | Vermeulen et al. |

FOREIGN PATENT DOCUMENTS

| | | | |
|---|---|---|---|
| CN | 101751359 A | 6/2010 | |
| JP | 03095415 A * | 4/1991 | ............. G01D 5/14 |
| JP | 05-049226 A | 2/1993 | |
| JP | 06-288431 A | 10/1994 | |
| JP | 10-089403 A | 4/1998 | |
| JP | 2002-525608 A | 8/2002 | |
| JP | 2002-540613 A | 11/2002 | |
| JP | 2007-027331 A | 2/2007 | |
| JP | 2008-060563 A | 3/2008 | |
| JP | 2009-016385 A | 1/2009 | |
| JP | 2009-278127 A | 11/2009 | |
| JP | 2010-153908 A | 7/2010 | |
| KR | 10-2009-0004506 A | 1/2009 | |

OTHER PUBLICATIONS

English-Language Abstract for Korean Patent Publication No. 10-2009-0004506 A, published Jan. 12, 2009; 1 page.

English-Language Abstract for Japanese Patent Publication No. 2002-540613 A, published Nov. 26, 2002; 1 page.

English-Language Abstract for Japanese Patent Publication No. 05-049226 A, published Feb. 26, 1993; 1 page.

English-Language Abstract for Chinese Patent Publication No. 101751359 A, published Jun. 23, 2010; 1 page.

\* cited by examiner (a)

(b)

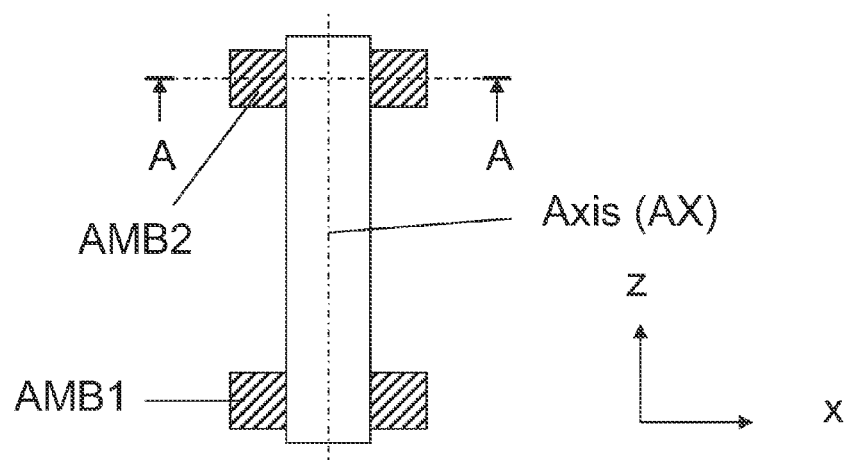
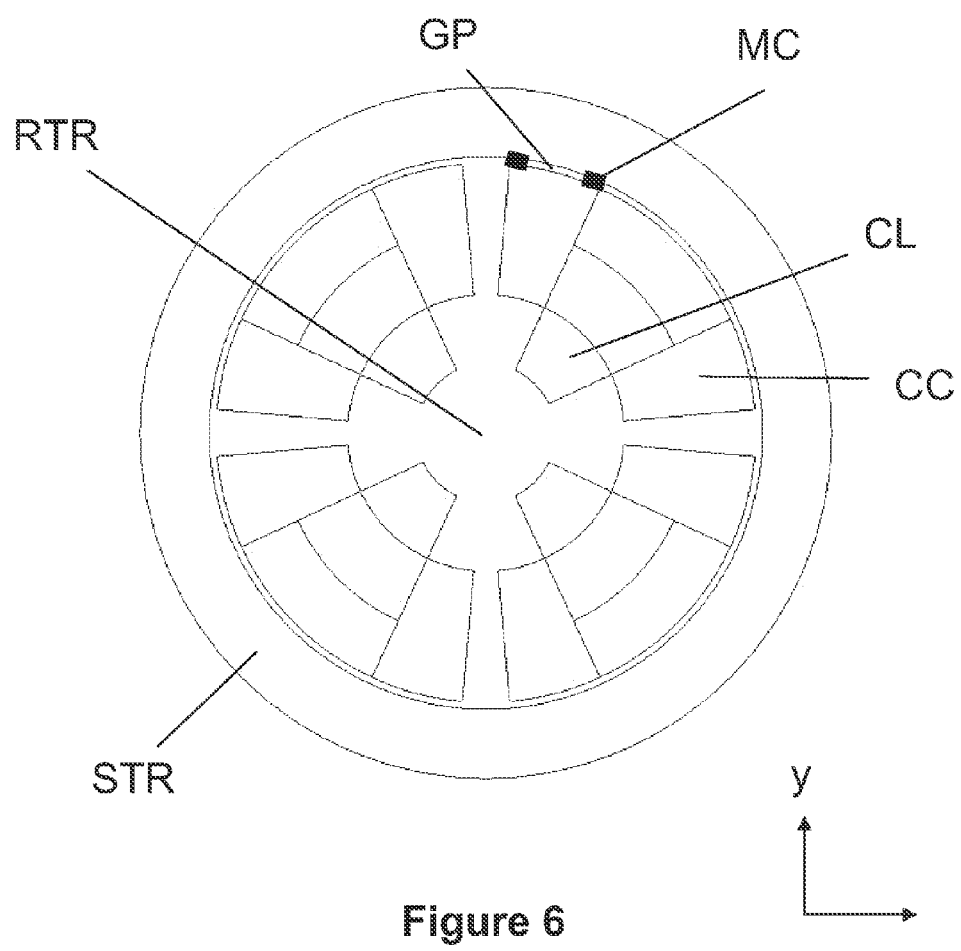

VARIABLE RELUCTANCE DEVICE, STAGE APPARATUS, LITHOGRAPHIC APPARATUS AND DEVICE MANUFACTURING METHOD

CROSS REFERENCE TO RELATED APPLICATIONS

This application claims benefit under 35 U.S.C. 119(e) to U.S. Provisional Application No. 61/362,887, filed Jul. 9, 2010, which is incorporated by reference herein in its entirety.

BACKGROUND

1. Field of the Present Invention

The present invention relates to a variable reluctance device which can e.g., be applied in a stage apparatus or a lithographic apparatus and a method for manufacturing a device.

2. Background Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate. In order to accurately position the patterning device relative to the wafer or substrate, a lithographic apparatus is often provided with one or more positioning device for positioning an object table e.g., holding a patterning device or a substrate. Such positioning devices can e.g., comprise one or more linear motors and/or linear devices such as Lorentz devices for positioning an object table or support. In a lithographic apparatus, both accurate positioning and throughput (e.g., expressed as the number of wafers that can be processed per hour) can be considered equally important. In order to obtain a high throughput, powerful devices and motors are required enabling high accelerations and decelerations of the object table thereby reducing any idle time between consecutive exposures. In order to obtain an accurate positioning, an accurate control of the force as generated by the linear motor or device, is required. In order to meet these requirements, Lorentz devices are often applied for an accurate (e.g., 6 degrees of freedom (DOF)) positioning as such devices enable an accurate control of the generated force. However, compared to other types of devices such as variable reluctance devices, the force density or force vs. dissipation obtainable using a Lorentz device is comparatively small. Compared to Lorentz devices, a variable reluctance device would enable a improved force density while at the same time reducing (moving) mass of the device and the dissipation level. Variable reluctance devices however suffer from the drawback that an accurate force control is rendered difficult because the device force is strongly dependent on the relative position of the magnetic members of a variable reluctance device. As such, using known variable reluctance devices, it is difficult to predict the devices response when a certain magnetizing current is applied.

SUMMARY

It is desirable to provide a variable reluctance device or in general, an other type of electromagnetic device enabling a more accurate force control.

According to an embodiment of the present invention, there is provided a variable reluctance device comprising first and second magnetic members, a coil, a measurement coil, and a control unit. The first and second magnetic members are displaceable relative to each other to provide a magnetic circuit having a variable reluctance. The coil is used to receive a current generates a magnetic flux through the magnetic circuit. The measurement coil generates a measurement signal representative of the magnetic flux through the magnetic circuit. The measurement coil is arranged to substantially enclose the magnetic flux through the magnetic circuit. The control unit is arranged to receive the flux signal at an input terminal and, in response, provide a control signal based on the measurement signal at an output terminal for controlling an amplitude of the current or a force of a further device.

In another embodiment of the present invention, there is provided a stage apparatus for positioning an object, the apparatus comprising an object table, a base, and a variable reluctance device. The object table receives the object. The base supports the object table. The variable reluctance device positions the object table relative to the base.

In yet another embodiment of the present invention, there is provided a lithographic apparatus comprising an illumination system, a support, a substrate table, a stage, and a projection system. The illumination system is configured to condition a radiation beam. The support is constructed to support a patterning device, the patterning device being capable of imparting the radiation beam with a pattern in its cross-section to form a patterned radiation beam. The substrate table is constructed to hold a substrate. The projection system is configured to project the patterned radiation beam onto a target portion of the substrate. The a stage positions the patterning device or the substrate.

In yet another embodiment of the present invention, there is provided a device manufacturing method comprising transferring a pattern from a patterning device onto a substrate, wherein the method comprises the step of positioning the patterning device and/or the substrate by a stage apparatus according to the present invention.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention FIG. 1 depicts a lithographic apparatus, according to an embodiment of the present invention.

Figure 2A:
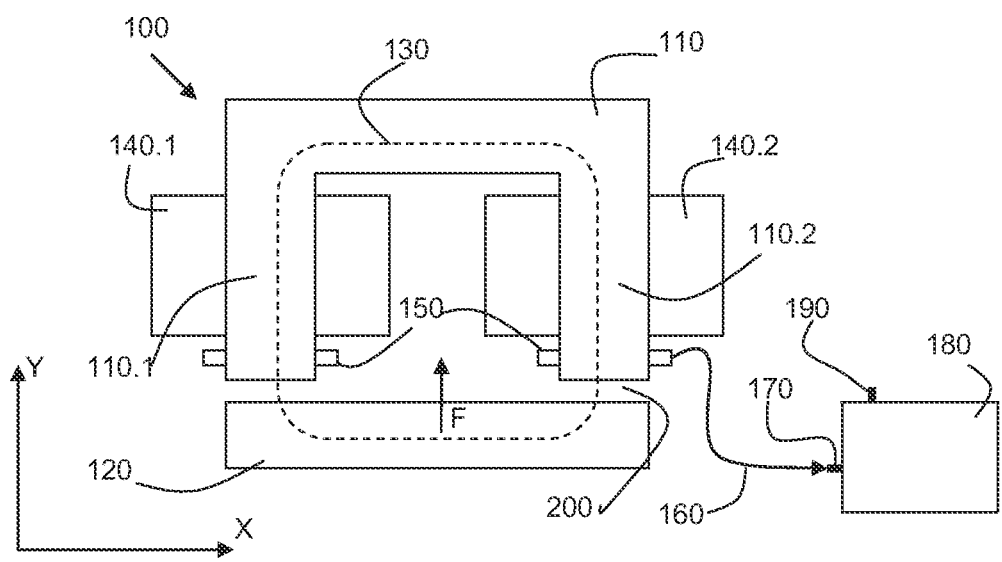

FIG. 2a depicts a cross-sectional view of a first variable reluctance device, according to an embodiment of the present invention.

Figure 2B:
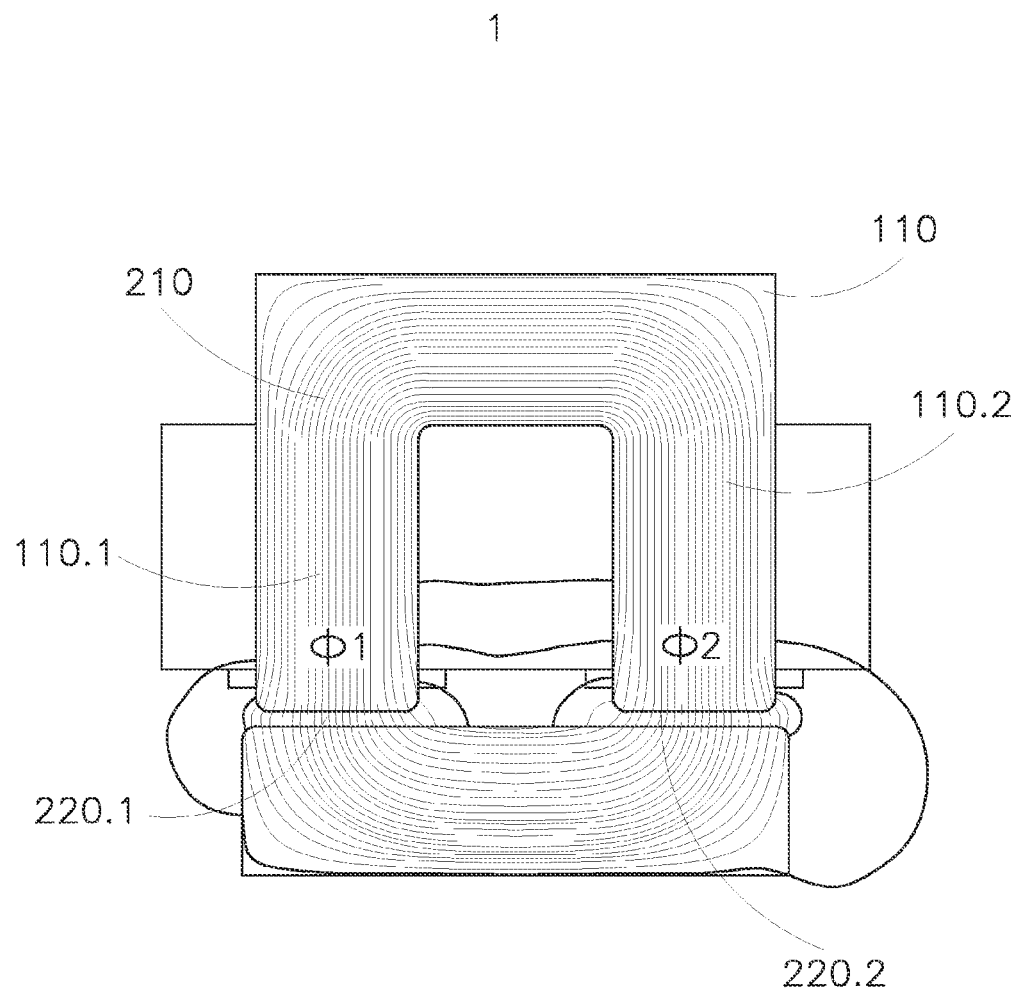

FIG. 2b schematically depicts a magnetic flux distribution of the device shown in FIG. 2a.

Figure 3A:
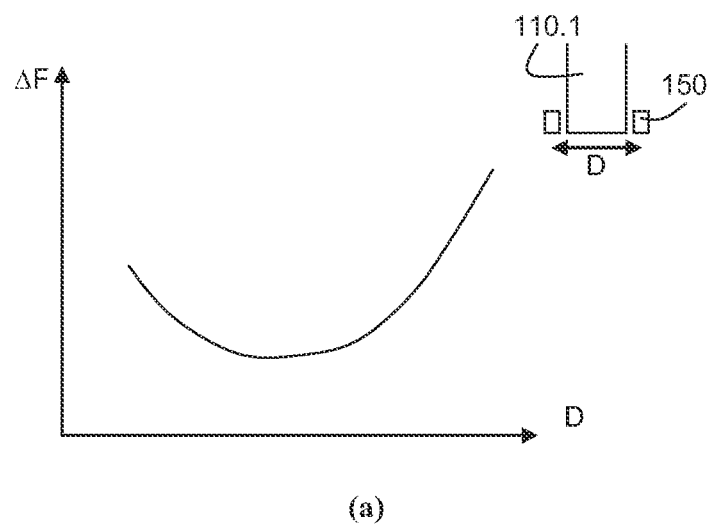
Figure 3A:
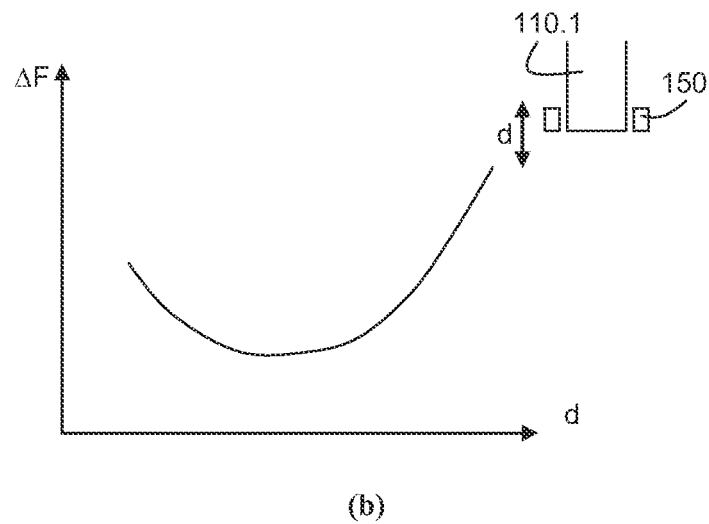

FIG. 3a schematically depicts a force deviation as a function of the measurement coil position and geometry.

Figure 3B:
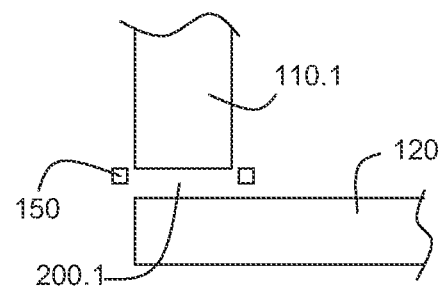

FIG. 3b schematically depicts an optimized position and geometry of the measurement coil relative to a magnetic member of the device.

Figure 4A:
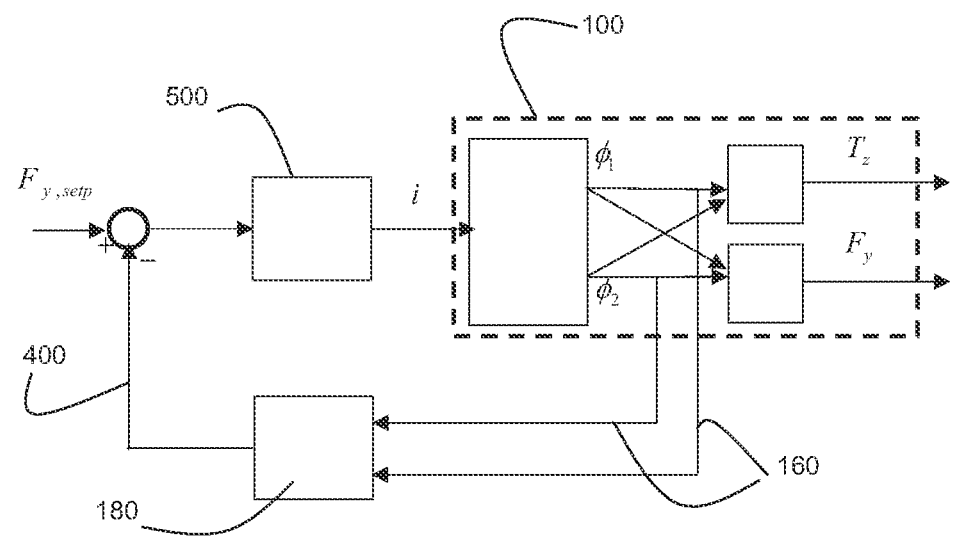
Figure 4B:
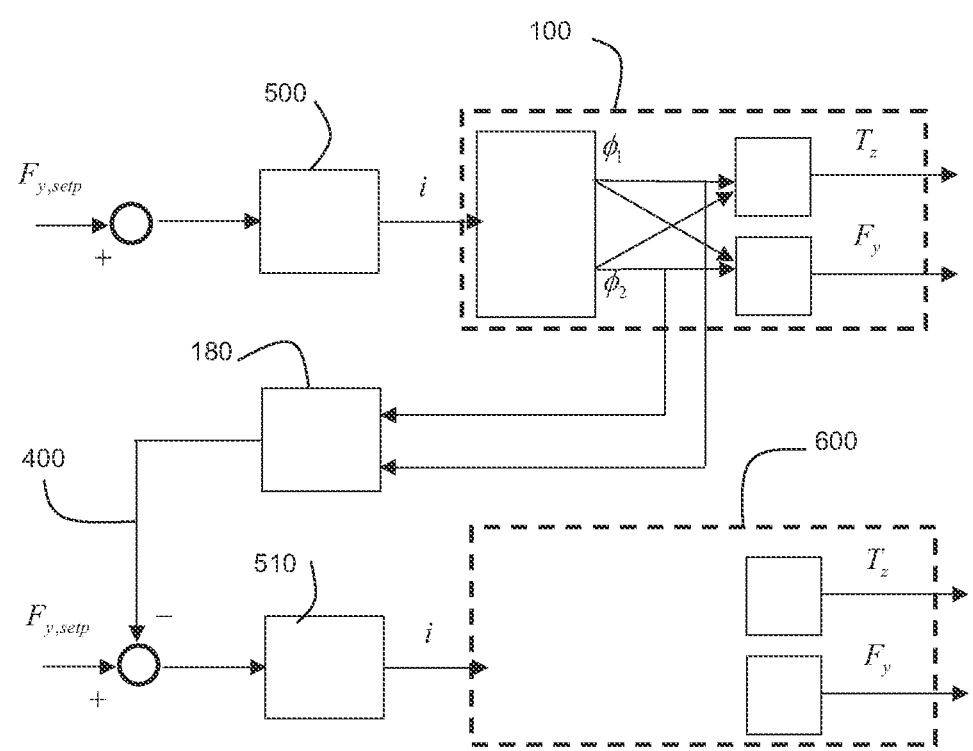
Figure 4C:
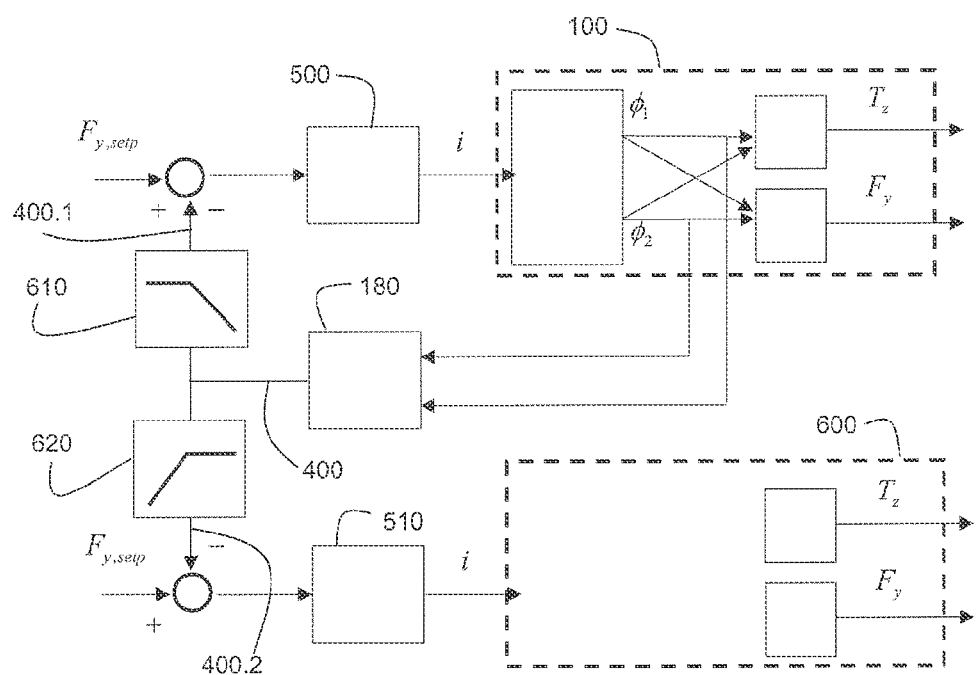

FIGS. 4a, 4b, and 4c schematically depict three different control schemes as can be applied by an device according to embodiments of the present invention.

FIG. 5 schematically depicts a further embodiment of a variable reluctance device, according to the present invention.

FIG. 6 schematically depicts a cross-sectional view of the variable reluctance device as shown in FIG. 5.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus according to one embodiment of the present invention. The apparatus includes an illumination system (illuminator) IL configured to condition a radiation beam B (e.g., UV radiation or any other suitable radiation), a mask support structure (e.g., a mask table) MT constructed to support a patterning device (e.g., a mask) MA and connected to a first positioning device PM configured to accurately position the patterning device in accordance with certain parameters. In an embodiment, the lithographic apparatus comprises a stage apparatus according to the present invention as a first positioning device PM, for accurate positioning of the patterning device. The apparatus also includes a substrate table (e.g., a wafer table or in general an object table) WT or "substrate support" constructed to hold a substrate (e.g., a resist-coated wafer) W and connected to a second positioning device PW configured to accurately position the substrate in accordance with certain parameters. In an embodiment, the lithographic apparatus comprises a stage apparatus according to the present invention as a second positioning device PW, for accurate positioning of the substrate or wafer. The apparatus further includes a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is-reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW, e.g., a stage apparatus according to the present invention. In the case of a stepper (as opposed to a scanner) the mask table MT may be connected to a short-stroke device only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The lithographic apparatus according to the present invention may, as mentioned, comprise a stage apparatus according to the present invention for positioning an object such as a patterning device or a substrate. Note however that other applications of a stage apparatus according to the present invention or the variable reluctance device according to the present invention in a lithographic apparatus are feasible as well. As an example, the variable reluctance device according to the present invention can e.g., be applied for positioning reticle masking blades, optical components of the projections system, etc.

In the following, more details are provided on the variable reluctance device and the stage apparatus according to the present invention.

In FIG. 2a, a cross-sectional view of a first variable reluctance device according to the present invention is shown. The device 100 comprises a first magnetic member 110 (also referred to as the stator) and second magnetic member 120 (also referred to as the mover) which are displaceable relative to each other (e.g., in the X-direction) thus forming a magnetic circuit (indicated by the dotted line 130 through which a magnetic flux can flow. In order to generate such a magnetic flux, the device is provided with a coil 140 (in the embodiment as shown, the coil comprises a first coil 140.1 and a second coil 140.2), the coil being arranged to receive a current, e.g., from a power supply (not shown). As shown in the embodiment, the coils 140.1 and 140.2 are wound about legs 110.1 and 110.2 of the first magnetic member respectively. The coils or coil may also be mounted on other positions on the first magnetic member or the second magnetic member. The magnetic members can e.g., be manufactured using ferrous materials having a comparatively high permeability such as ferrites or sintered materials comprising rare earth materials. The variable reluctance device further comprises a measurement coil 150 for generating a measurement signal 160. The measurement signal can e.g., be a voltage induced in the measurement coil 150 due the magnetic flux that is generated in the magnetic circuit. According to the present invention, the measurement coil 150 is arranged to substantially enclose the magnetic flux through the magnetic circuit 130. It has been devised by the inventors that a measurement signal representative of the magnetic flux through the magnetic circuit enables an accurate prediction of the generated force, substantially without the requirement for additional measurements, this in contrast to know local measurements of e.g., the flux density in an device airgap, e.g., using Hall sensors. The measurement signal 160 as obtained from the measurement coil is, according to the present invention, provided to an input terminal 170 of a control unit 180 of the device. The control unit can, e.g., comprise an integrator (not shown) for obtaining a signal representative of the magnetic flux through the magnetic circuit from the measurement signal (e.g., the induced voltage). The control unit 180 is further adapted to generate, based on the measurement signal 160, a control signal at an output terminal 190 of the control unit, whereby the control signal can be applied for controlling the amplitude of the current provided to the coil 140. As such, the control unit can e.g., be provided to the power supply to control the current as provided. As an alternative or in addition, the control signal derived by the control unit may also be applied to control a force of a further device, as is explained in more detail below. As will be demonstrated further on, applying a measurement coil which is arranged to substantially enclose the magnetic flux through the magnetic circuit 130, e.g., about a leg of one of the magnetic members 110, 120 of the device 100 enables to provide a measurement signal to a control unit which can be applied to obtain a more accurate control of a force applied to an object (e.g., an object table in a lithographic apparatus), and thus a more accurate position control of the object.

It has further been devised by the inventors that an optimal geometry and position of the measurement coil can be found enabling an improved force prediction in an operating area of the device.

In general, in a reluctance type of device, the force F, see FIG. 2a, is strongly dependent on the relative position of the magnetic members 110, 120. The force F can be expressed as:

$$F = k(x, z) \cdot \frac{i^2}{(y + y_0)^2} \quad (1)$$

where y represents the gap 200 between both magnetic members 110, 120, i.e., the stator 110 and the mover 120 of the device and $y_0$ represent an offset value. It can be noted that in use, the stator 110 is in general mounted to a stationary part and the mover is mounted to the object to be positioned or moved (e.g., an object table). From equation (1), the stiffness C of the device can be obtained by differentiating (1):

$$C = -\frac{\partial F}{\partial y} = 2k \cdot \frac{i^2}{(y + y_0)^3} = 2\frac{F}{(y + y_0)} \quad (2)$$

Showing a strong positional dependency of the generated force F.

Typically, the variable reluctance device's stiffness may be as high as $2 \cdot 10^6$ [N/m].

As will be acknowledged by the skilled person, in order to obtain an accurate position control, an accurate prediction of the generated force F by the device is required.

As such, in case the position (and orientation) of the mover relative to the stator is known, the force variations (due to the device's stiffness) could be calculated according to (2) and the current provided to the coil 140 could be corrected to adjust the force to the desired level.

It has been observed by the inventors that the determination of the relative position of the stator and the mover may be cumbersome or at least insufficiently accurate for determining the generated force F or stiffness C. The following obstacles can be identified:

When applied in a lithographic apparatus, the stator of the reluctance device would be connected to a long stroke positioner (e.g., part of positioner PW or PM as described above), which positioning errors have a dynamic character and are in the order of 10-100 [μm] during acceleration. A position measurement of the long stroke positioner combined with a position measurement of an object table (to which the mover is mounted) could render an estimate of the position of the mover relative to the stator. These relative position measurements however only provide a limited accuracy due to limited mechanical stiffness of the mechanics between the device's mover and stator.

System heating may lead to mechanical deformations and change in relative position of mover and stator.

A direct measurement of the relative position between mover and stator could be considered, but would require a dedicated position measurement system (thus adding costs) and seems unfeasible due to space limitations.

As such, there is a strong need to obtain an accurate force prediction of a reluctance type device without having to measure a relative position of the stator and the mover of the device.

By appropriate positioning of a measurement coil such that the coil substantially encloses the magnetic flux generated in the magnetic circuit, an accurate force prediction can be obtained.

In order to illustrate this, FIG. 2b schematically depicts a magnetic flux distribution 210 of the device shown in FIG. 2a. In FIG. 2b, Φ1 represents the magnetic flux crossing air gap 220.1 at an end portion of leg 110.1 of the first magnetic member of the device whereas Φ2 represents the magnetic flux crossing air gap 220.2 at an end portion of leg 110.2 of the first magnetic member 110.

Referring to FIG. 2a, a measurement coil 150 is provided about each leg 110.1, 110.2 for measuring the magnetic flux, Φ1 resp., Φ2. Note that, as in general, Φ1 will equal, Φ2, a single measurement coil wound about a leg of either the first or second magnetic member may be sufficient to determine the flux through the magnetic circuit.

Based upon the magnetic fluxes Φ1 and Φ2 the force and torque of the device can be calculated according to:

$$F_y = f \cdot (\phi_1^2 + \phi_2^2)$$

$$T_z = g \cdot (\phi_1^2 - \phi_2^2) \quad (3)$$

where $\phi_1$ and $\phi_2$ correspond to the magnetic fluxes through the poles or legs of the reluctance device respectively as shown in FIG. 2b. Note that, in a C-core type device as schematically depicted, the torque Tz about the Z-axis is generally considered a parasitic effect.

As is apparent from equation (3), In case the fluxes Φ1 and Φ2 and parameters f and g are known, the exact force and torque can be calculated, e.g., by a control unit and fed back as a control signal to either a position controller or a power supply. In this way a correction can be made for any deviations from an intended force set point. The magnetic flux through the poles can e.g., be determined by integrating the voltage across the measurement coil or coils.

Note that, in general, parameters f and g in equation (3) may, albeit slightly, depend on the relative position of the mover and the stator. It has been devised by the inventors that a unique geometry and position of the measurement coil can be found at which the position dependency of the gains f and g from equation (4) are minimized, within an operating area of the device. In order to arrive at the optimal position and/or geometry simulations have been performed whereby the position and geometry was changed and the force generated by the device (at various positions of the stator relative to the mover, i.e., thus defining an operating area of the device) was compared to a calculated force using equation (3), whereby parameter f was held constant. In FIG. 3a, the maximum deviation ΔF between the generated force and the calculated force (determined at various positions of the stator relative to the mover, i.e., over the operating area of the device) is shown in a graph (a) for various geometries of the measurement coil (denoted by variations in the width D of the measurement coil 150) and in a graph (b) for various positions of the measurement coil relative to a leg 110.1 of the device (denoted by variations in the relative position d of the measurement coil 150 relative to the leg 110.1). As can be noted, unique positions can be found that minimise the force deviation ΔF shown in the graphs. These unique positions are determined by the geometry of the stator and mover and occurring air gaps between mover and stator.

As such, in an embodiment, a cross-section of the measurement coil substantially perpendicular to the magnetic flux or the position of the measurement coil is selected so as to minimize a deviation between an actual force of the device (which can either be obtained from measurement or from simulations) and a calculated force in an operating area of the device, the calculated force Fc being determined as:

$$Fc = k \cdot \phi^2,$$

whereby k is held a constant and $\phi$ represents the magnetic flux as derived from the measurement signal.

With respect to the position of the measurement coil relative to the magnetic member or leg of the magnetic member, is has been found that, surprisingly, the optimal position of the measurement coil is at least partly inside the air gap separating the first and second magnetic member. This is schematically illustrated in FIG. 3b showing a close-up of the member 110.1 and 120 of the device of FIG. 2a and the measurement coil 150 in an optimal position in the air gap 200.1.

It is worth noting that by applying the measurement coil optimum position and geometry, an extensive calibration and or additional measurements are rendered unnecessary, while still obtaining an accurate force feed back by means of a magnetic flux sensing.

With respect to the lay-out of the magnetic members of the variable reluctance device according to the present invention, it can be noted that various options exist. In the embodiment as schematically shown in FIGS. 2a and 2b, the first magnetic member comprises a so-called C-core, i.e., the magnetic member has the shape of a letter C. It is worth mentioning that other shapes such as an E-core could be applied as well whereby one or more measurement coils can e.g., be provided on one or more legs of the C- or E-core.

It is furthermore worth noting that the magnetic circuit of the reluctance device according to the present invention, i.e., either the first magnetic member or the second magnetic member may comprise one or more permanent magnets which can generate a bias magnetic flux in the magnetic circuit. Such a bias magnetic flux may generate a magnetic flux and thus a force between the first and second magnetic member even when the current supplied to the coil is equal to zero. Such a bias force may e.g., be advantageous in case the device is applied for supporting objects in the Z-direction, i.e., the vertical direction. In such arrangements, the bias force can be applied to at least partly counteract the weight of the object to be supported and thereby reducing dissipation in the device coil.

When, in accordance with the present invention, a measurement signal is generated by the measurement coil and provided to the control unit, the control unit can determine a control signal, based on the measurement signal. Additionally the flux measurement by the coils may be used in combination with (well-known) Hall elements. In such an embodiment the flux measurement by the coils may be used to accurately measure the high frequent fluxes, whereas the Hall elements may be used for measuring the low frequent fluxes (DC). This is beneficial as based on the measurements from both the coils and the Hall elements a high bandwidth force feedback may be accomplished.

In an embodiment, the control signal can be applied to correct the current as applied to the device, in order to obtain a more accurate force F by the reluctance type device according to the present invention. Such an arrangement is schematically shown in FIG. 4a schematically showing variable reluctance device 100 including the control unit 180 arranged to receive a measurement signal 160 representative of the magnetic flux. Based on the measurement signal, a control signal 400 is determined by the control unit which is compared to a force set point (F y, setp) and fed to a power supply 500 arranged to provide a current i to the device. As such, a correction can be made for any deviations from an intended force set point.

In an embodiment, schematically depicted in FIG. 4b, the control signal 400 as determined by the control unit 180 is provided to control or adjust a force set point of a further device 600, e.g., a Lorentz device. In such an arrangement, the variable reluctance device can co-operate with a further device for providing a force (or torque) in a certain direction in order to e.g., control a position of an object mounted on an object table. The combined forces of the variable reluctance device and the further device are thus used to obtain a desired force set point. In the arrangement, the control signal 400 is compared with the force set point F y setp and used by a power supply 510 supplying a current i to the further device 600.

In yet another embodiment, low frequent disturbances could be fed back to the reluctance device's control loop while high frequent disturbances are provided to the further device control loop. This strategy will limit the required force to be generated by the further device or devices, since the low frequent disturbances (which can be relatively large) are handled by the variable reluctance device. This embodiment is schematically shown in FIG. 4c which, compared to FIG. 4b, comprises a low pass filter 610 and a high pass filter 620. In the embodiment, the control signal 400 is passed through the low-pass filter 610 for obtaining a first filtered control signal 400.1 and is passed through the high-pass filter 620 for obtaining a second filtered control signal 400.2, whereby the first filtered control signal is applied for controlling the force of the variable reluctance device 100 and whereby the second filtered control signal is applied for controlling the force of the further device 600, e.g., a Lorentz device.

The variable reluctance device as described may e.g., be applied in a stage apparatus for positioning an object such as a patterning device or a substrate in a lithographic apparatus. In such a stage apparatus, the variable reluctance device can e.g., be applied for accurate positioning of an object table. In such a stage apparatus, any of the strategies described in FIGS. 4a-4c can be applied in order to obtain an accurate correspondence between a desired force set point and an actual force, determined from a measurement signal obtained from a measurement coil substantially enclosing the magnetic flux of the magnetic circuit of the reluctance type device. As such, referring to the strategies described in FIGS. 4b and 4c, the stage apparatus can comprising a further device (e.g., a Lorentz device), whereby the force to be generated by the Lorentz device is based on a deviation between the desired force F y setp and a calculated actual force of the variable reluctance device.

In yet a further embodiment the measurement coil may e.g. be applied in an active magnetic bearing (AMB). An example of such an embodiment is shown in FIG. 5, showing an axis (AX) that can freely rotate around the axis in z-direction (Rz-device not shown), whereas it is supported by active magnetic bearings (AMB) that actively control the position of the axis (AX) in the x- and y-directions. In the example shown in FIG. 5, two of these active magnetic bearings (AMB1, AMB2) are shown, which actually allows to control the axis (AX) in the x, y, Rx and Ry directions. Bearings for the z- and Rz-directions are not shown, but the axis (AX) may for example be supported in the z-direction by any suitable passive or active bearing.

FIG. 6 shows a cross-sectional view, as indicated by the arrows 'A' in FIG. 5 showing the active magnetic bearing (AMB) working on the principle of electromagnetic suspension between the rotor (RTR) and stator (STT) comprising an electromagnet assembly (CL, CC), a set of power amplifiers (not shown) for supplying current to the electromagnets (CC), a controller (not shown) and the measurement coil (MC) according to the present invention with the associated electronics to provide the feedback required to control the position of the rotor (RTR) within the gap (GP). The working principle of the measurement coil (MC) is similar as described for the other embodiments and accordingly the general working principle of the measurement coil (MC) as described for an device is also valid for the application with an active magnetic bearing (AMB). In a typical embodiment the power amplifiers supply equal bias current to the electromagnets arranged around the rotor (RTR). In the example as shown in FIG. 6, three pairs of active magnetic bearings (AMB) are shown, but another number of active magnetic bearings (AMB) such as, 2, 4 or even more are also possible. The position of the rotor (RTR) is controlled by the controller which offsets the bias current as the rotor deviates from its center position. Active magnetic bearings have several advantages in comparison with conventional bearings as they do not suffer from wear, have low friction, and active magnetic bearings can often accommodate irregularities in the mass distribution automatically, allowing it to spin around its centre of mass with very low vibration.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the present invention in the context of optical lithography, it will be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV)

radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the present invention have been described above, it will be appreciated that the present invention may be practiced otherwise than as described.

The descriptions above are intended to be illustrative, not limiting. Thus, it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A stage apparatus for positioning an object, the apparatus comprising:
    an object table configured to receive the object;
    a base configure to support the object table;
    a variable reluctance device configured to position the object table relative to the base, comprising:
        first and second magnetic members that are displaceable relative to each other and are configured to provide a magnetic circuit having a variable reluctance,
        a coil configured to, in use, receive a current for generating a magnetic flux through the magnetic circuit,
        a measurement coil configured to generate a measurement signal representative of the magnetic flux through the magnetic circuit, and
        a control unit arranged to receive the measurement signal at an input terminal and, in response, to provide a control signal based on the measurement signal at an output terminal; and
    a second device configured to position the object table,
    wherein the control signal is passed through a low-pass filter to generate a first filtered signal and is passed through a high-pass filter to generate a second filtered signal,
    wherein the first filtered signal is applied to control a current of the variable reluctance device and the second filtered signal is applied to control a force provided by the second device.

2. The stage apparatus of claim 1, wherein
the measurement coil is further configured to substantially enclose the magnetic flux through the magnetic circuit.

3. The stage apparatus of claim 1, wherein at least a portion of the measurement coil is located within a gap between the first and second magnetic members.

4. The stage apparatus of claim 1, wherein the coil is wrapped around one or more legs of the first magnetic member.

5. The stage apparatus of claim 1, wherein the first magnetic member is coupled to a long stroke positioner.

6. The stage apparatus of claim 1, wherein at least one of the first and second magnetic members comprises a permanent magnet configured to generate a bias magnetic flux in the magnetic circuit.

7. The stage apparatus of claim 1, further comprising:
    a plurality of active magnetic bearings configured to control a position of the second magnetic member relative to the first magnetic member.

8. A stage apparatus for positioning an object, the apparatus comprising:
    an object table configured to receive an object;
    a base configured to support the object table; and
    a variable reluctance device configured to position the object table relative to the base, the variable reluctance device comprising,
        first and second magnetic members separated by a gap, wherein the gap is the shortest distance between the first and second magnetic members, and configured to be displaceable relative to each other and to provide a magnetic circuit having a variable reluctance,
        a coil configured to receive a current and to generate a magnetic flux through the magnetic circuit,
        a measurement coil configured to generate a measurement signal representative of the magnetic flux through the magnetic circuit, wherein at least a portion of the measurement coil is located within the gap, and
        a control unit arranged to receive the measurement signal at an input terminal and, in response, provide a control signal based on the measurement signal at an output terminal for controlling an amplitude of the current,
    wherein the control signal is passed through a low-pass filter for obtaining a first filtered control signal and is passed through a high-pass filter for obtaining a second filtered control signal,
    wherein the first filtered control signal is applied for controlling the current of the variable reluctance device, and
    wherein the second filtered control signal is applied for controlling the force provided by a second device.

9. The stage apparatus according to claim 8, wherein the second device is configured to position the object table.

10. The stage apparatus of claim 8, wherein the coil is wrapped around one or more legs of the first magnetic member.

11. The stage apparatus of claim 8, wherein the first magnetic member is coupled to a long stroke positioner.

12. The stage apparatus of claim 8, wherein at least one of the first and second magnetic members comprises a permanent magnet configured to generate a bias magnetic flux in the magnetic circuit.

13. The stage apparatus of claim 8, further comprising:
   a plurality of active magnetic bearings configured to control a position of the second magnetic member relative to the first magnetic member.

\* \* \* \* \*